United States Patent [19]
Yabe

[11] Patent Number: 5,995,430
[45] Date of Patent: Nov. 30, 1999

[54] SEMICONDUCTOR MEMORY DEVICE

[75] Inventor: Tomoaki Yabe, Fujisawa, Japan

[73] Assignee: Kabushiki Kaisha Toshiba, Kawasaki, Japan

[21] Appl. No.: 09/025,860

[22] Filed: Feb. 19, 1998

[30] Foreign Application Priority Data

Feb. 21, 1997 [JP] Japan .................................. 9-037630

[51] Int. Cl.[6] .............................. G11C 7/00; G11C 8/00
[52] U.S. Cl. ....................... 365/203; 365/233; 365/233.5
[58] Field of Search .................................. 365/203, 233, 365/233.5, 230.08

[56] References Cited

U.S. PATENT DOCUMENTS 5,668,774  9/1997  Furutani .................................. 365/233
5,844,849  12/1998  Furutani .......................... 365/230.08 X
5,848,015  12/1998  Seno ........................................ 365/203

Primary Examiner—Huan Hoang
Attorney, Agent, or Firm—Banner & Witcoff, Ltd.

[57] ABSTRACT

An overlaid DQ type DRAM of a clock synchronous type is provided with a column address transition detector circuit, to control pre-charging and equalizing of pairs of DQ lines. An address for selecting a DQ line muptiplexer in a stage prior to a DQ buffer is set to a predetermined column address, and a transition of a column address is detected in a first pipeline stage of a column access path. When only the bit of the predetermined column address changes with the other column address bits kept unchanged, DQ lines are pre-charged and equalized.

24 Claims, 11 Drawing Sheets

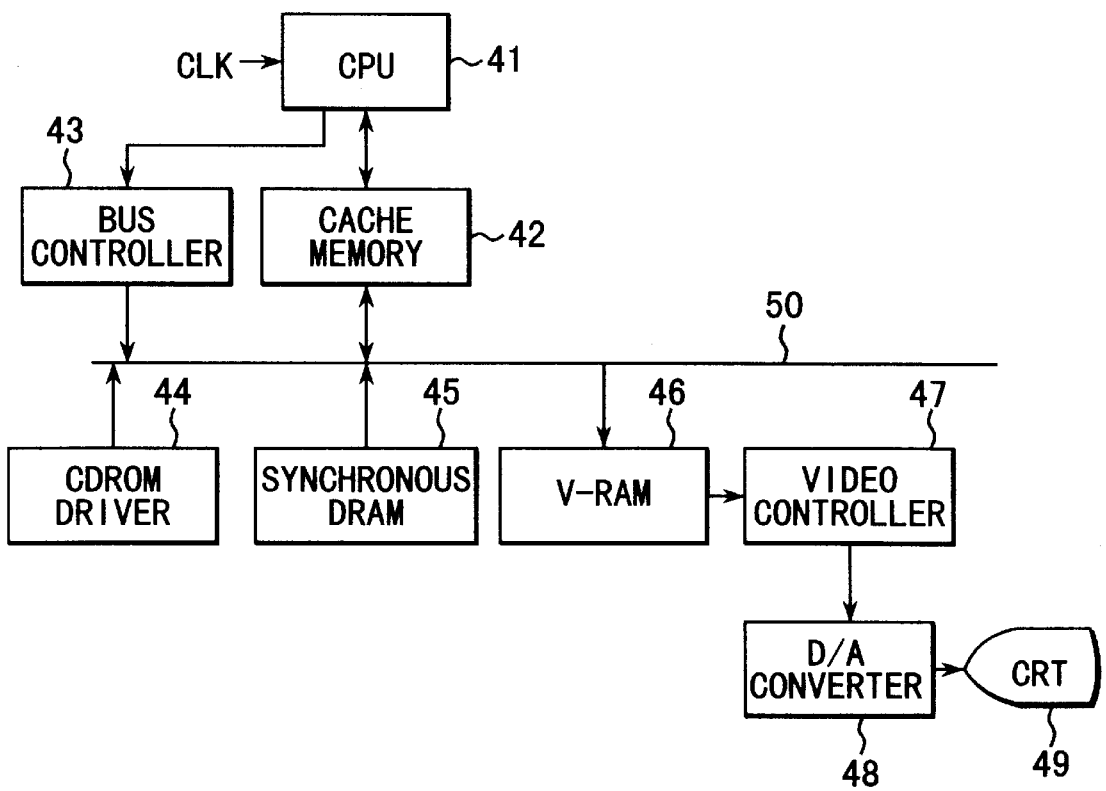
F I G. 5

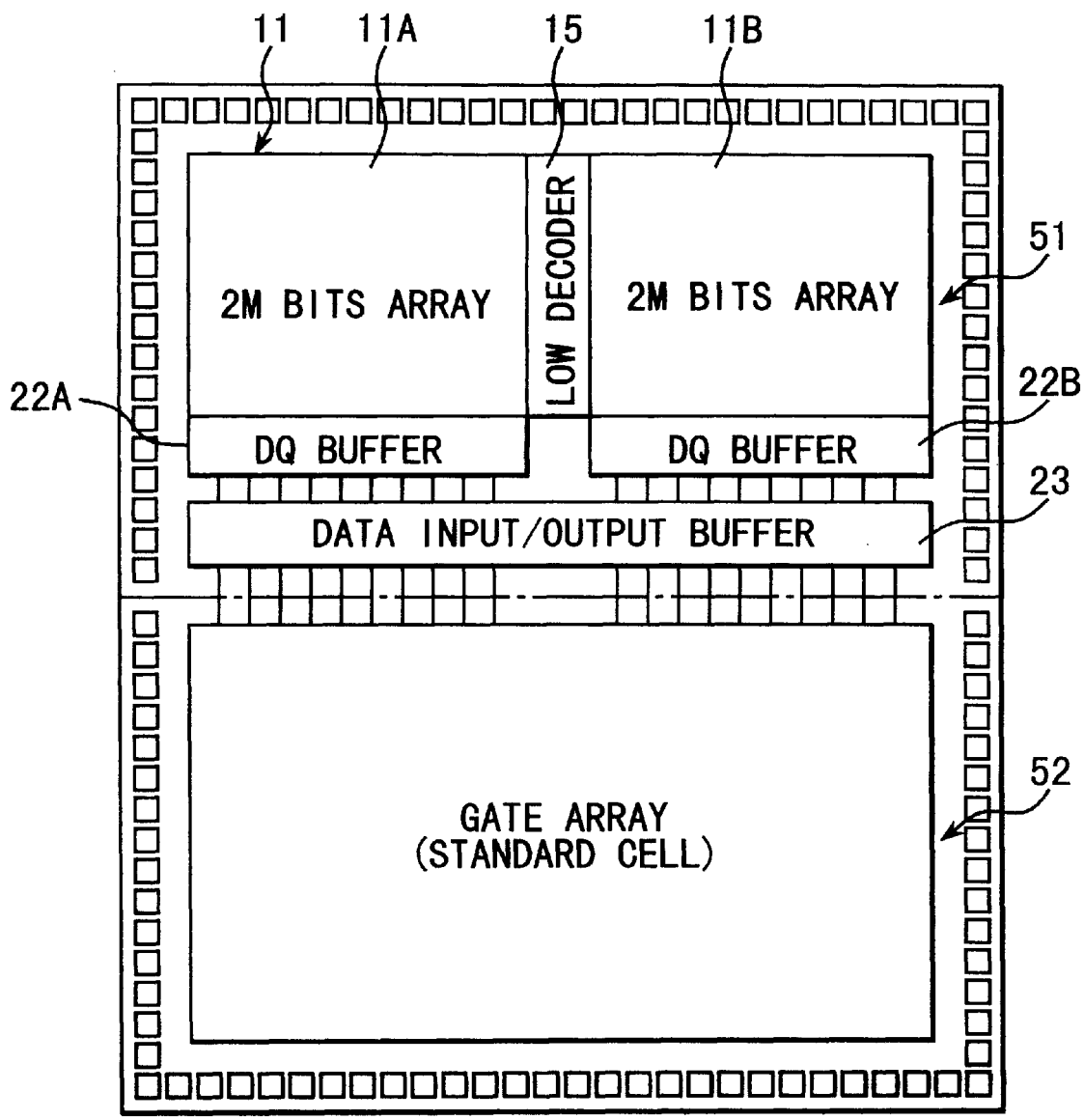
F I G. 6

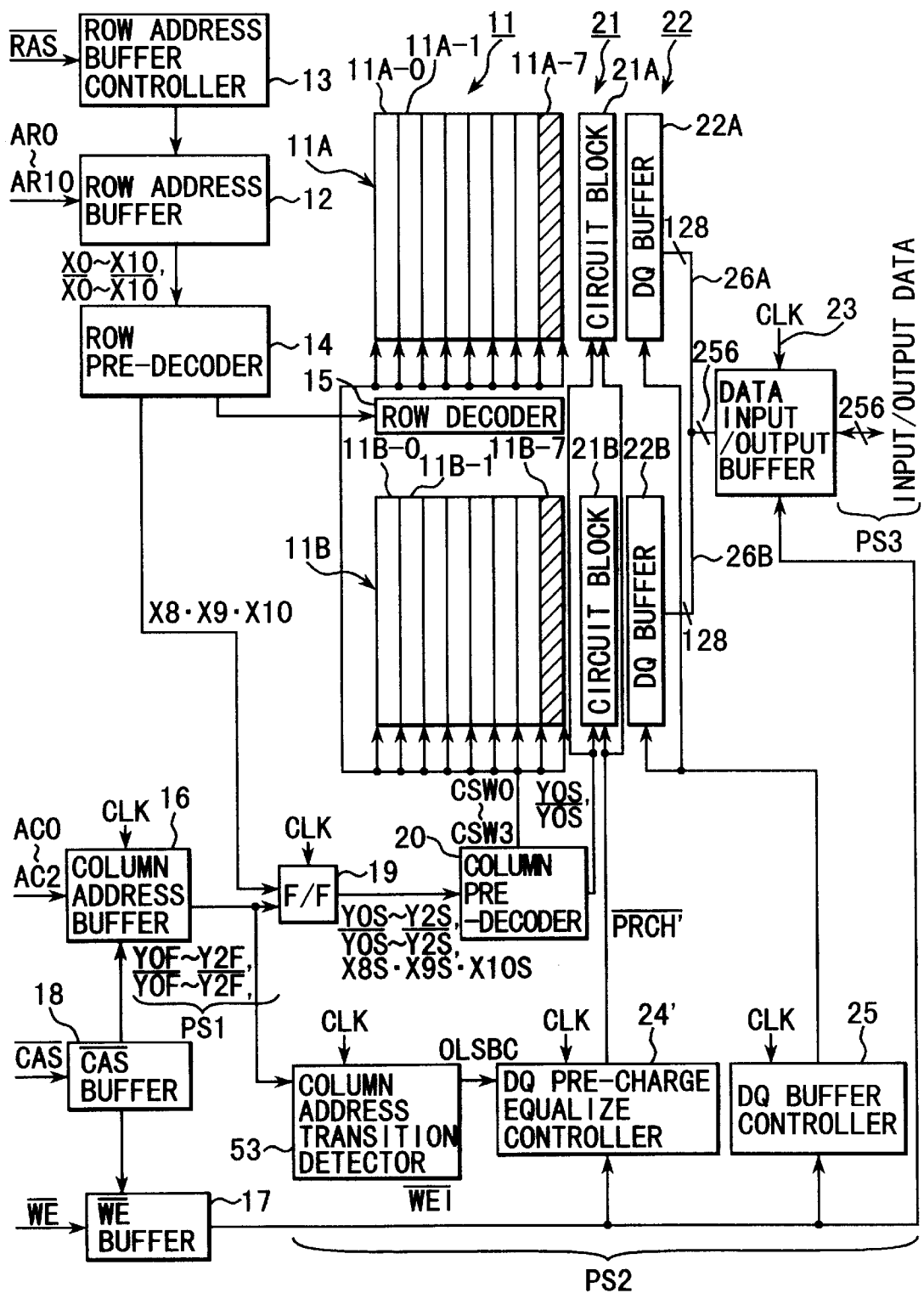
F I G. 7

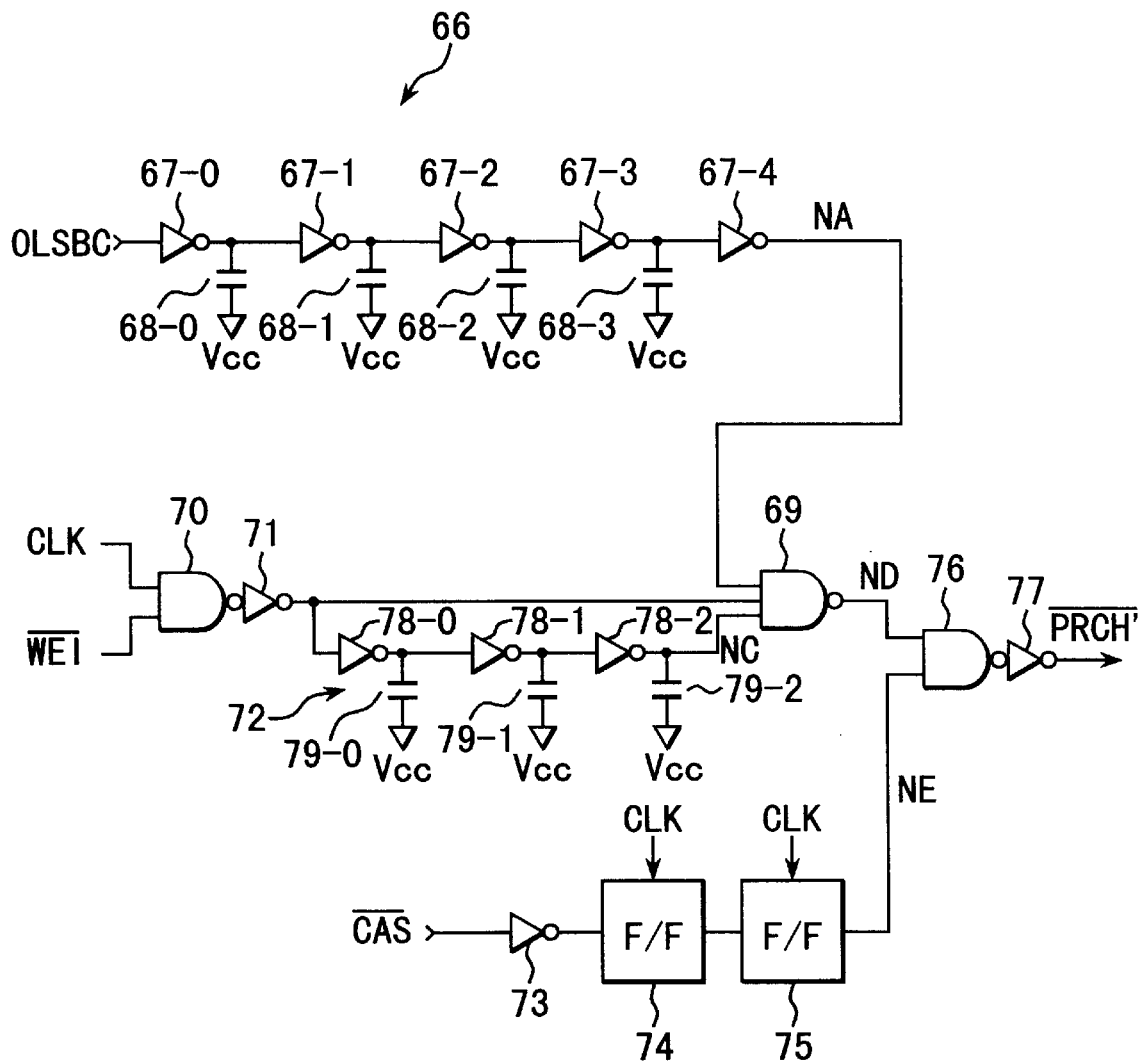
F I G. 12

SEMICONDUCTOR MEMORY DEVICE

BACKGROUND OF THE INVENTION

The present invention relates to a semiconductor memory device, and particularly, to a DRAM (Dynamic Random Access Memory) of a clock synchronous type having an Overlaid DQ structure and pre-charging of data lines of the DRAM.

This application is based on Japanese Patent Application No. 9-37630, filed on Feb. 21, 1997, the contents of which is cited herein by reference.

FIG. 1 explains a conventional semiconductor memory device and is a block diagram showing a schematic structure of a clock synchronous type 4M-bit DRAM having an overlaid DQ structure. The DRAM comprises a memory cell array 11, a row address buffer 12, a row address buffer controller 13, a row pre-decoder 20, a circuit block 21, a DQ buffer 22, a data I/O buffer 23, a DQ pre-charge/equalize controller 24, and a DQ buffer controller 25.

The memory cell array 11 of 4M-bit consists of two 2M-bit arrays 11A and 11B, and the 2M-bit arrays 11A and 11B respectively consist of eight 256K-bit cell array blocks 11A-0 to 11A-7 and eight 256K-bit cell array blocks 11B-0 to 11B-7. Each of the cell array blocks 11A-0 to 11A-7 and 11B-0 to 11B-7 is constructed in a structure of 256 rows×1K columns in which dynamic type memory cells are arranged in a matrix consisting of rows and columns. The row controller 13 receives a /RAS signal and controls the row address buffer 12. The sign "/" of the /RAS signal means this signal is an inverted or a bar of a RAS signal. Hereinafter, in the present specification, "/" is used to indicate an inverted signal. When the /RAS signal is at a low level, the row address buffer 12 latches a row address signals AR0 to AR10 in synchronization with a clock signal CLK, under control of the row controller 13, and generates interpolation signals X0 to X10 and /X0 to /X10. The interpolation signals X0 to X10 and /X0 to /X10 are supplied to the row pre-decoder 14 and pre-decoded. Thereafter, the interpolation signals are supplied to the row decoder 15 provided between the 2M-bit arrays 11A and 11B and are decoded. Selection and activation are made with respect to sixteen 256K blocks 11A-0 to 11A-7 and 11B-0 to 11B-7, with use of interpolation signals X8 to X10 and /X8 to /X10 generated from upper three bits of 11 bits of the row address signals AR0 to AR10. Two blocks which sandwich the row decoder 15 are simultaneously activated (as shown in FIG. 1 in which block 11A-7 and 11B-7 marked with oblique lines are activated). Rows of memory cells are selected in the blocks selected with use of interpolation signals X0 to X7 and /X0 to /X7 generated from the other remaining 8 bits of the row address signals.

The column address buffer 16 latches a column address signal AC0 to AC2 of 3 bits in synchronization with a clock signal CLK when the signal /CAS goes to a low level under control by the /CAS buffer 18. The column address buffer 16 performs a flip-flop operation (waveforms of which will be described later) synchronized with the clock signal CLK. The column address buffer 16 converts the column address signals AC0 to AC2 into interpolation signals Y0F to Y2F and /Y0F to /Y2F. The interpolation signals Y0F to Y2F and /Y0F to /Y2F are supplied to the flip-flop 19 and are converted into Y0S to Y2S and /Y0S to /Y2S. In this step, eight selection signals (/X8·/X9·/X10, X8·X9·X10, . . . , and X8·X9·X10 which are abbreviated and indicated as X8·X9·X10 in the figure) of cell array blocks generated by the row pre-decoder 14 are also converted into signals X8S·X9S·X10S by the flip-flop 19. Those column address signals are supplied to the column pre-decoder 20 and column switch selection signals CSW0 to CSW3 are generated. The column switch signals CSW0 to CSW3 are generated by obtaining a logical product of upper two bits of Y1S, /Y1S, Y2S, and /Y2S and a signal X8S·X9S·X10S, as expressed in the following logic.

CSW0=/Y1S·/Y2S·X8S·X9S·X10S
CSW1=Y1S·/Y2S·X8S·X9S·X10S
CSW2=/Y1S·Y2S·X8S·X9S·X10S
CSW3=Y1S·Y2S·X8S·X9S·X10S

One of the column switch signals CSW0 to CSW3 corresponding to a selected cell array block is activated by the above logical calculation.

In addition, interpolation signals Y0S and /Y0S output from the column pre-decoder 20 are supplied to a circuit block 21. The circuit block 21 consists of first and second circuit blocks 21A and 21B respectively corresponding to 2M-bit arrays 11A and 11B, and each of the first and second circuit blocks 21A and 21B is provided with a DQ multiplexer, a DQ pre-charger a DQ equalizer, and the like. Likewise, a DQ buffer 22 consists of first and second buffer sections 22A and 22B respectively corresponding to the 2M-bit arrays 11A and 11B, and outputs of the buffer sections 22A and 22B are supplied to the data I/O buffer 23 respectively through RWD busses 26A and 26B each consisting of 128 lines (i.e. total 256 lines). The data I/O buffer 23 is supplied with clock signal CLK and an output signal from a /WE buffer 17, and controls inputs/outputs of data.

The /WE buffer 17 is controlled by an output signal from the /CAS buffer 18, and latches a /WE signal. A DQ pre-charge/equalize controller 24 receives a clock signal CLK, /CAS signal, and an output signal from the /WE buffer 17 and generates a pre-charge signal /PRCH. The DQ pre-charge/equalize controller 24 uses the pre-charge signal /PRCH to control the first and second circuit blocks 21A and 21B, so that pre-charging and equalizing of DQ lines are controlled. The DQ buffer controller 25 is supplied with a clock signal CLK described above and an output signal from the /WE buffer 17, and controls the first and second buffer sections 22A and 22B of the DQ buffer 22.

256 pairs of DQ lines are provided on the 2M-bit cell arrays 1A and 11B and are connected to the DQ buffers 22A and 22B through the DQ multiplexer, the DQ pre-charger, and the DQ equalizer. In this respect, FIG. 2 shows more details. 1K columns (or a pair of bit lines) of each of the blocks 11A-0 to 11A-7 and 11B-0 to 11B-7 are connected with 1024 sense amplifiers (S/A) 27-0 to 27-1023. Outputs of the sense amplifiers are supplied to multiplexers (4:1 MUX) 28-0 to 28-255, in units of four outputs. Output ends of the multiplexers 28-0 to 28-255 are respectively connected to 256 pairs of DQ lines 29-0 and /29-0 to 29-255 and /29-255. By four column switch selection signals CSW0 to CSW3 output from the column decoder 20, one is selected from output signals of four sense amplifier, supplied to each of the multiplexers 28-0 to 28-255, and is output to pairs of DQ lines 29-0 and /29-0 to 29-255 to /29-255. The pairs of DQ lines 29-0 and /29-0 to 29-255 and /29-255 are connected with PMOS transistors 30-0 to 30-255 which serve as DQ equalizers, and with PMOS transistors 31-0 to 31-255 and 32-0 to 32-255 which serve as DQ pre-chargers. The current paths of the PMOS transistors 30-0 to 30-255 is connected between the DQ lines 29-0 to 29-255 and a power source Vcc. The current paths of the PMOS transistors 31-0 to 31-255 are connected between the DQ lines /29-0 to /29-255 and the power source Vcc. The gates of the PMOS transistors 30-0 to 30-255, 31-0 to 31-255, and 32-0 to 32-255 are supplied with a pre-charge signal /PRCH output from the DQ pre-charge/equalize controller 24 to perform ON/OFF control.

The 256 pairs of DQ lines 29-0 and /29-0 to 29-255 and /29-255 are connected to 128 DQ multiplexers (2:1 MUS) 33-0 to 33-127, in units each consisting of two pair of DQ lines. Each of the DQ multiplexers 33-0 to 33-12 selects one pair of two pairs of DQ lines connected thereto, in accordance with interpolation signals Y0S and /Y0S (or the lowermost bit of the column address) output from the column pre-decoder 20. Specifically, when the signal /Y0S is at a high level, pairs of DQ lines 29-1 and /29-1, 29-3 and /29-3, ..., and 29-255, and /29-255 are selected, and data on these DQ lines is supplied to the DQ buffers 22-0 to 22-127, so that read data is amplified. Output signals of the DQ buffers 22-0 to 22-127 are respectively supplied to RWD busses 26-0 to 26-127.

In the structure as described above, 1K lines of columns corresponding to the 2M cell arrays 11A and 11B are multiplexed at a ratio of 4:1 by the column switch selection signals CSW0 to CSW3, and are connected to the 256 pairs of DQ lines. In this state, the column switch selection signals CSW0 to CSW3 are common to the 256 pairs. Specifically, when one of the column switch selections signals CSW0 to CSW3 is selected, e.g., when the signal CSW0 is selected, 256 sense amplifiers 27-0, 27-4, 27-8, ..., and 27-1021 are simultaneously connected to the pairs of DQ-lines 29-0 and /29-0, 29-1 and /29-1, ..., and 29-255 and /29-255, and data held by the sense amplifiers is read out onto the DQ lines.

FIG. 3 is a block diagram extracting and more specifically showing a circuit section relating to bit lines, sense amplifiers and pairs of DQ lines shown in the block diagram of FIG. 2. 1K pieces of sense amplifiers 27 are divided into groups each consisting of four sense amplifiers and arranged at both ends of each of 256K blocks. Each sense amplifier 27 is connected with a pair of bit lines BL and /BL. The pairs of bit lines BL and /BL are arranged such that bit lines of the sense amplifiers in one side are inserted between bit lines of the other sense amplifiers in the opposite side. Four sense amplifiers 27 of each group are connected to a pair of DQ lines 29 and /29, through current paths of NMOS transistors 34-0 to 34-7 which serve as a multiplexer 28, respectively. The gates of the NMOS transistors 34-0 to 34-7 are supplied with column switch selection signals CSW0 to CSW3, output data of the sense amplifier 27 corresponding to that one of the column switch selection signals which is of a high level is read out onto the pair of DQ lines 29 and /29.

The pair of DQ lines 29 and /29 is used in common by eight cell array blocks and is arranged in a direction parallel to the bit lines BL and /BL (i.e., in an overlaid DQ structure). A DRAM having this overlaid DQ structure allows a number of pairs DQ lines to be provided in a small chip area, and is therefore used for a logic mixture DRAM having a large number of data inputs and outputs.

FIG. 4 is a timing chart for explaining operation of the circuit shown in FIGS. 1 to 3. Next, explanation of the operation will be made mainly with respect to pre-charge and equalize operation. Here, operation of column access will be made, supposing that a low address signal has been taken in with the /RAS signal kept at a low level, a word line has been selected, and latch operation of a selected row has been carried out.

When the /CAS signal goes to a low level, column address signals AC0 to AC2 are taken in by the column address buffer 16 by control of the /CAS buffer 18, and column addresses CA0, CA1, and CA2 are sequentially generated in clock cycles 0 to 2, respectively. A column access signal path from the column address buffer 16 to a data output is divided into three pipe line stages, e.g., the column address buffer 16 which performs flip-flop operation, a flip-flop 19 in the stage before the column pre-decoder 20, and a data I/O buffer 23 which also performs flip-operation. The route through which signals Y0F to F2F are transmitted from the column address buffer 16 to the flip-flop 19 is the first stage PS1. The route through which signals CSW0 to CSW3 and signals Y0S and /Y0S from the flip-flop 19 are activated and data of selected columns are latched by the data I/O buffer 23 through the pair of DQ lines 29 and /29, the DQ multiplexer 33, and the DQ buffer 22 is the pipe line second stage PS2. The last pipe line third stage PS3 corresponds to data outputting from the data I/O buffer 23.

In putted column addresses CA0, CA1, CA2, ... are transmitted through the pipe line stages PS1, PS2, and PS3 in clock cycles 0, 1, 2, ..., respectively. Specifically, signals /Y0F, /Y1F, and /Y2F are activated in the 0th clock cycle, and signals /Y0S, /Y1S, and /Y2S, and CSW0 are activated in the next first clock cycle. When the signal CSW0 is thereby turned to a high level, data of sense amplifiers 27-0, 27-4, ..., 27-1021 shown I FIG. 2 is read through pairs of DQ lines 29-0 and /29-0 to 29-255 and /29-255. Since the signal /Y0S is now at a high level, data of the pairs of DQ lines 29-0 and /29-0, 29-2 and /29-2, ..., 29-254 and /29-254 among 256 pairs of DQ lines is supplied to the DQ buffers 22-0 to 22-127 through the multiplexers 33-0 to 33-127 and is amplified. In this state, data of the pairs of DQ lines 29-1 and /29-1, 29-3 and /29-3, ..., 29-255 and /29-255 does not passes through the multiplexers 33-0 to 3-127, and therefore is not read onto the DQ buffers 22-0 to 22-127.

Next, the column address CA1 input before the first clock cycle activates the signals Y0F, /Y1F, and /Y2F in the first clock cycle, and further, activates the signals Y0S, /Y1S, /Y2S, and CSW0 in the second clock cycle. Since the signals /Y1S, /Y2S, and CSW0 have already been activated in the first clock cycle, data to be read (D1 in FIG. 4) has already been output to the pairs of DQ lines 29-1 and /29-1, 29-3 and /29-3, ..., 29-255 and /29-255.

However, in a conventional clock synchronous DRAM as described above, since the pairs of DQ lines are pre-charged and equalized in every clock cycle, and data read out onto the pairs of DQ lines 29-1 and /29-1, 29-3 and /29-3, ..., 29-255 and /29-255 is broken by the pre-charging and equalizing operation and is read out again onto these DQ lines in the second clock cycle. Such wasteful pre-charging and equalizing operation leads to a problem that charging and discharging currents of DQ lines are increased, resulting in an increase of the power consumption of the chip.

In addition, the number of data lines has been increased in accordance with technical developments in recent years. Accordingly, the ratio of the power consumption of DQ lines to the entire power consumption of a semiconductor memory device has increased, so that the power consumption of DQ lines cannot be negligible.

Further, a conventional memory system using a semiconductor memory device as described above must use an expensive ceramic package in order to overcome heat generation caused by an increase of the power consumption, so that the cost of the entire system is increased.

BRIEF SUMMARY OF THE INVENTION

The present invention has an object of providing a semiconductor memory device in which discharging and charging currents of pairs of DQ lines are reduced so that the power consumption of the chip can be reduced.

Another object of the present invention is to provided a memory system in which a heat generation amount can be restricted by reducing wasteful power consumption and the cost of the entire system can be reduced by reducing a cost for a package.

According to a first aspect of the present invention, there is provided a semiconductor memory device comprising: a memory cell array including a plurality of memory cells; an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal; a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal; a plurality of data lines for transferring data read out from the desired number of memory cells selected; a pre-charge circuit for pre-charging the plurality of data lines; a multiplexer input with the data read out on the plurality of data lines, for selecting a part of the data lines, based on a selection signal indicating a predetermined part of the address signal; an amplifier for amplifying data on the part of the data lines selected by the multiplexer; and a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the predetermined part thereof indicated by the selection signal changes with the predetermined part kept unchanged.

According to a second aspect of the present invention, there is provided a semiconductor chip comprising: a memory section; and a logic circuit section for transferring data between the memory section and the logic circuit itself, the memory section including: a memory cell array including a plurality of memory cells; an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal; a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal; a plurality of data lines for transferring data read out from the desired number of memory cells selected; a pre-charge circuit for pre-charging the plurality of data lines; a multiplexer input with the data read out on the plurality of data lines, for selecting a part of the data lines, based on a selection signal indicating a predetermined part of the address signal; an amplifier for amplifying data on the part of the data lines selected by the multiplexer; and a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the predetermined part thereof indicated by the selection signal changes with the predetermined part kept unchanged.

According to a third aspect of the present invention, there is provided a memory system comprising: a CPU (central processing unit) supplied with a clock signal; a cash memory for sending/receiving data to/from the CPU; a system bus for transferring data from and to the cash; a bus controller for controlling the system bus; and a synchronous DRAM (dynamic random access memory) for burst-transferring data onto the system bus, the synchronous DRAM including: a memory cell array having a plurality of memory cells; an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal; a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal; a plurality of data lines for transferring data read out from the desired number of memory cells selected; a pre-charge circuit for pre-charging the plurality of data lines; a multiplexer input with the data read out on the plurality of data lines, for selecting a part of the data lines, based on a selection signal indicating a predetermined part of the address signal; an amplifier for amplifying data on the part of the data lines selected by the multiplexer; and a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the predetermined part thereof indicated by the selection signal changes with the predetermined part kept unchanged.

In a semiconductor memory device, a semiconductor chip, or a memory system as described above, the pre-charging circuit is controlled by a controller. A transition of an address is detected, in the pipeline stage prior to the pipeline stage in which a plurality memory cells are selected and data is read out from the selected memory cells. Only in the case where any other address than the selection signal changes with the selection signal kept unchanged, the plurality of data lines are pre-charged before data reading, by the pre-charging circuit. As a result of this, data of non-selected pairs of DQ lines read out in a first clock cycle can be effectively used, and the discharging and charging currents of pairs of DQ lines are reduced so that the power consumption can be reduced.

According to a fourth aspect of the present invention, there is provided a semiconductor memory device comprising: a memory cell array of a matrix layout; a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal; a column decoder for decoding the address signal output from the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal; data line groups respectively provided so as to correspond to columns of the column group selected by the column decoder; a pre-charge circuit for pre-charging the data line groups; a multiplexer input with data on the data line groups, for selecting a part of the data line groups, based on a multiplexer selection address included in the column address signal; an amplifier for amplifying data on the part of data lines of the part of the data line groups selected by the multiplexer; and a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

According to a fifth aspect of the present invention, there is provided a semiconductor chip comprising: a memory section; and a logic circuit section for transferring data between the memory section and the logic circuit itself, the memory section including: a memory cell array adopting a layout consisting of rows and columns; a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal; a column decoder for decoding the address signal output form the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal; data line groups respectively provided so as to correspond to columns of the column group selected by the column decoder; a pre-charge circuit for pre-charging the data line groups; a multiplexer input with data on the data line groups, for selecting a part of the data line groups, based on a multiplexer selection address included in the column address signal; an amplifier for amplifying data on the part of data lines of the part of the data line groups selected by the multiplexer; and a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

According to a sixth aspect of the present invention, there is provided a memory system comprising: a CPU (central processing unit) supplied with a clock signal; a cash memory for sending/receiving data to/from the CPU; a system bus for transferring data from and to the cash; a bus controller for controlling the system bus; and a synchronous DRAM (dynamic random access memory) for burst-transferring data onto the system bus, the synchronous DRAM including: a memory cell array of a matrix layout; a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal; a column decoder for decoding the address signal output form the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal; data line groups respectively provided so as to correspond to columns of the column group selected by the column decoder; a pre-charge circuit for pre-charging the data line groups; a multiplexer input with data on the data line groups, for selecting a part of the data line groups, based on a multiplexer selection address included in the column address signal; an amplifier for amplifying data on the part of data lines of the part of the data line groups selected by the multiplexer; and a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

In a semiconductor memory device, a semiconductor chip, or a memory system as described above, the pre-charging circuit is controlled by a pre-charge controller. A transition of a column address is detected, in the pipeline stage prior to the pipeline stage in which an arbitrary column group of a memory cell array is selected and data is read out from memory cells onto the data line group. Only in the case where any other column address than a multiplexer selection address changes with the multiplexer selection address kept unchanged, the data line group is pre-charged before data reading, by the pre-charging circuit. As a result of this, data of non-selected pairs of DQ lines read out in a first clock cycle can be effectively used, and the discharging and charging currents of pairs of DQ lines are reduced so that the power consumption can be reduced.

According to a seventh aspect of the present invention, there is provided a semiconductor memory device comprising: a memory cell array on which memory cells of a dynamic type are arranged in a matrix layout; a plurality of DQ lines provided on bit lines of the memory cell array, in a direction parallel to the bit lines; a multiplexer for selecting desired DQ lines from the plurality of DQ lines; a DQ pre-charger for pre-charging the plurality of DQ lines; a DQ buffer supplied with an output signal from the selected DQ lines; a data I/O buffer supplied with an output signal from the DQ buffer; a row address buffer input with a row address signal; a row controller for controlling the row address buffer in response to a row address strobe signal; a row pre-decoder supplied with an interpolation signal of the row address signal output from the row address buffer; a row decoder for decoding output signal from the row pre-decoder to select a row of the memory cell array; a column address buffer input with a column address signal; a WE buffer input with a write enable signal, for controlling the data I/O buffer; a /CAS buffer for controlling the column address buffer and the /WE buffer, in response to a column address strobe signal; a flip-flop for generating a logic signal, based on a part of a logic signal from an upper side of the row pre-decoder and on an output signal from the column address buffer; a column pre-decoder for decoding the logic signal from the flip-flop, to supply the memory cell array with a column switch selection signal; a column address transition detector supplied with a part of the output signal of the column address buffer, for detecting a transition of a column address; a DQ pre-charger controller supplied with an output signal from the column address transition detector and an output signal from the /WE buffer, for controlling the DQ pre-charger so as to pre-charge the DQ lines when only a predetermined bit of the column address changes with any other address bit kept unchanged; and a DQ buffer controller for controlling the DQ buffer, based on the output signal from the /WE buffer.

According to an eighth aspect of the present invention, there is provided a semiconductor chip comprising: a memory section; and a logic circuit section for transferring data between the memory section and the logic circuit itself, the memory section including: a memory cell array on which memory cells of a dynamic type are arranged in a matrix layout; a plurality of DQ lines provided on bit lines of the memory cell array, in a direction parallel to the bit lines; a multiplexer for selecting desired DQ lines from the plurality of DQ lines; a DQ pre-charger for pre-charging the plurality of DQ lines; a DQ buffer supplied with an output signal from the selected DQ lines; a data I/O buffer supplied with an output signal from the DQ buffer; a row address buffer input with a row address signal; a row controller for controlling the row address buffer in response to a row address strobe signal; a row pre-decoder supplied with an interpolation signal of the row address signal output from the row address buffer; a row decoder for decoding output signal from the row pre-decoder to select a row of the memory cell array; a column address buffer input with a column address signal; a WE buffer input with a write enable signal, for controlling the data I/O buffer; a /CAS buffer for controlling the column address buffer and the /WE buffer, in response to a column address strobe signal; a flip-flop for generating a logic signal, based on a part of a logic signal from an upper side of the row pre-decoder and on an output signal from the column address buffer; a column pre-decoder for decoding the logic signal from the flip-flop, to supply the memory cell array with a column switch selection signal; a column address transition detector supplied with a part of the output signal of the column address buffer, for detecting a transition of a column address; a DQ pre-charger controller supplied with an output signal from the column address transition detector and an output signal from the /WE buffer, for controlling the DQ pre-charger so as to pre-charge the DQ lines when only a predetermined bit of the column address changes with any other address bit kept unchanged; and a DQ buffer controller for controlling the DQ buffer, based on the output signal from the /WE buffer.

According to a ninth aspect of the present invention, there is provided a memory system comprising: a CPU (central processing unit) supplied with a clock signal; a cash memory for sending/ receiving data to/from the CPU; a system bus for transferring data from and to the cash; a bus controller for controlling the system bus; and a synchronous DRAM (dynamic random access memory) for burst-transferring data onto the system bus, the synchronous DRAM including: a memory cell array on which memory cells of a dynamic type are arranged in a matrix layout; a plurality of DQ lines provided on bit lines of the memory cell array, in a direction parallel to the bit lines; a multiplexer for selecting desired DQ lines from the plurality of DQ lines; a DQ pre-charger for pre-charging the plurality of DQ lines; a DQ buffer supplied with an output signal from the selected DQ lines; a data I/O buffer supplied with an output signal from the DQ buffer; a row address buffer input with a row address signal; a row controller for controlling the row address buffer in response to a row address strobe signal; a row pre-decoder supplied with an interpolation signal of the row address signal output from the row address buffer; a row decoder for decoding output signal from the row pre-decoder to select a row of the memory cell array; a column address buffer input with a column address signal; a WE buffer input with a write enable signal, for controlling the data I/O buffer; a /CAS buffer for controlling the column address buffer and the /WE buffer, in response to a column address strobe signal; a flip-flop for generating a logic signal, based on a part of a logic signal from an upper side of the row pre-decoder and on an output signal from the column address buffer; a column pre-decoder for decoding the logic signal from the flip-flop, to supply the memory cell array with a column switch selection signal; a column address transition detector supplied with a part of the output signal of the column address buffer, for detecting a transition of a column address; a DQ pre-charger controller supplied with an output signal from the column address transition detector and an output signal from the /WE buffer, for controlling the DQ pre-charger so as to pre-charge the DQ lines when only a predetermined bit of the column address changes with any other address bit kept unchanged; and a DQ buffer controller for controlling the DQ buffer, based on the output signal from the /WE buffer.

In a semiconductor memory device, a semiconductor chip, or a memory system as described above, a column address transition detector is provided and an output signal from the column address transition detector is supplied to a DQ pre-charger. DQ lines are pre-charged only in the case where a predetermined bit of a column address changes with any other address bit than the predetermined bit kept unchanged. As a result of this, data of non-selected pairs of DQ lines read out in a first clock cycle can be effectively used, and the discharging and charging currents of pairs of DQ lines are reduced so that the power consumption can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

FIG. 5 is a block diagram showing a structure of a personal computer including a memory system adopting a semiconductor memory device according to the present invention;

FIG. 6 is a plan view showing a pattern layout of a chip of a synchronous DRAM shown in FIG. 5, as a semiconductor memory device according to the present invention;

FIG. 7 is a block diagram showing an overlaid DQ type DRAM of a clock synchronous type;

FIG. 12 is a circuit configuration showing a structure example of a DQ pre-charge/equalize controller shown in FIG. 7.

DETAILED DESCRIPTION OF THE INVENTION

Figure 1:
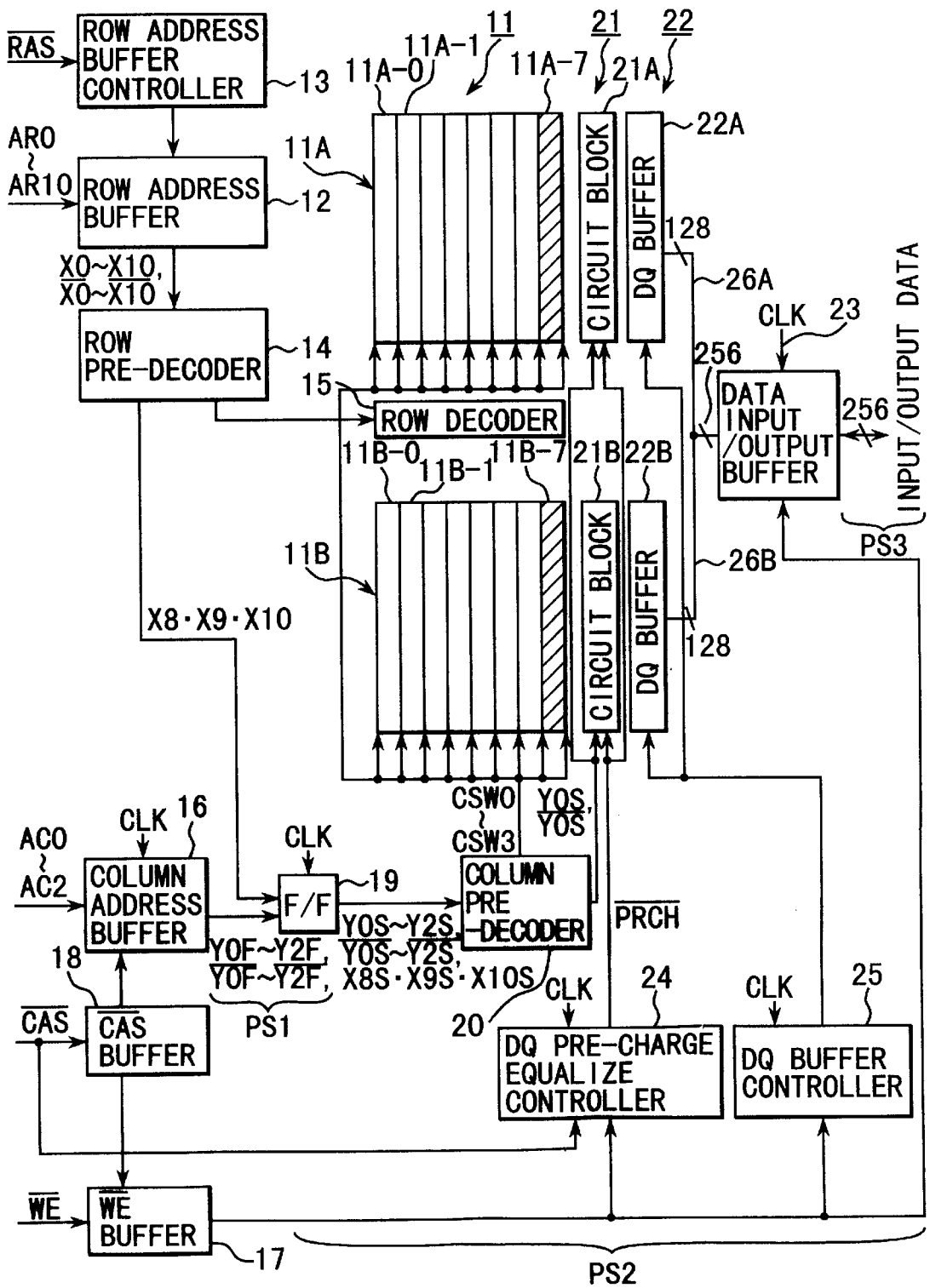
FIG. 1 is a block diagram showing a schematic structure of a clock synchronous type 4M-bit DRAM adopting a conventional overlaid DQ structure.
Figure 2:
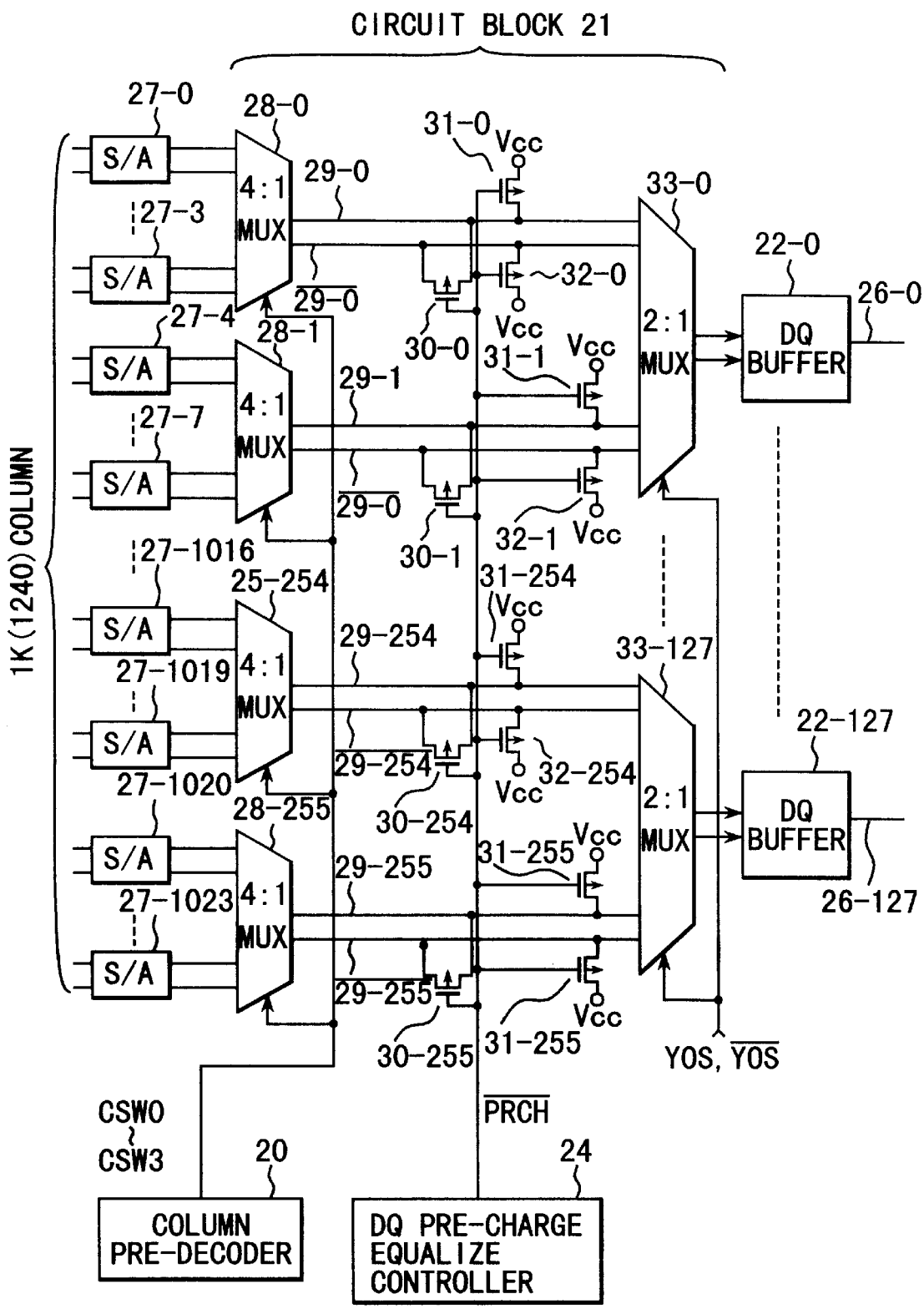
FIG. 2 is a block diagram specifically showing DQ lines shown in FIG. 1 and a circuit section in the periphery of the DQ lines.
Figure 3:
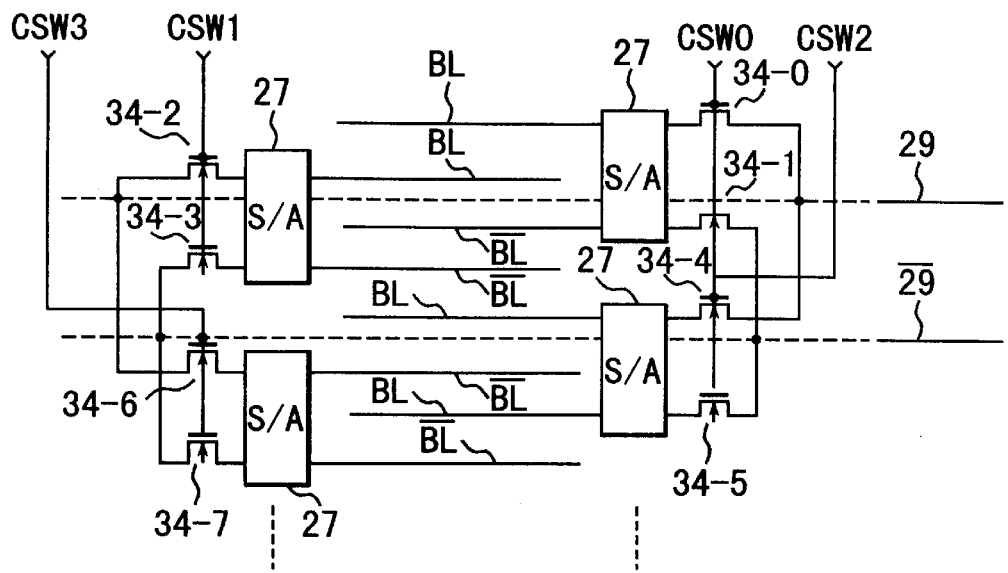
FIG. 3 is a block diagram specifically showing a circuit section related to bit lines, sense amplifiers, and pairs of DQ lines.

In the following, embodiments of the present invention will be explained with reference to the drawings.

FIG. 5 is a view for explaining a memory system adopting a semiconductor memory device according to the present invention. FIG. 5 shows a circuit section relating to a semiconductor memory device in a personal computer using the memory system.

The memory system is comprised of a CPU 41, cache memory 42, a bus controller 43, a CDROM (compact disk-read-only memory) driver 44, a synchronous DRAM (or clock synchronous type DRAM) 45, a video memory (VRAM) 46, a video controller 47, a D/A converter 48, a CRT (cathode-ray tube) display 49, a system bus 50, and the like.

The CPU 41 is supplied with a clock signal CLK. The CPU 41 operates in accordance with the clock signal CLK and makes random access with the cache memory 42 while controlling the bus controller 43. The cache memory 42, the bus controller 43, the CDROM driver 44, the synchronous DRAM 45 and the video memory 46 are connected through a system bus 50. Data read out from the synchronous DRAM 45 is burst-transferred onto the system bus 50. The bus controller 43 controls use of the system bus 50, based on control by the CPU 41. For example, image data read out from the CDROM driver 44 is supplied to the video memory 46 through the system bus 50, and is displayed on the CRT 49 through a video controller 47 and a D/A converter 48. Data read out from the synchronous DRAM 45 is supplied to the CPU 41 through the cache memory 42 and is used as various control data. Otherwise, data read out from the synchronous DRAM 45 is supplied to the video memory 46 through the system bus 50, and is displayed on the CRT 49 through the video controller 47 and the D/A converter 48.

FIG. 6 is a plan view showing a pattern layout of the chip of the synchronous DRAM 45 in the memory system shown in FIG. 5. A logic circuit section 52 consisting of a memory section 51 and a gate array, standard cell, or the like is embedded together on the DRAM chip. The memory section 51 is provided with 4M-bit memory cell array 11 which comprises two 2M-bit arrays 11A and 11B. A row decoder 15 is provided between the 2M-bit arrays 11A and 11B. Also, DQ buffers 22A and 22B and an I/O buffer 23 are provided, so that parallel transfer of 256-bit data is performed between the memory section 51 and the logic circuit 52.

FIG. 7 is a block diagram showing a structure of the memory section 51 in the pattern layout shown in FIG. 6. The memory section 51 is a clock synchronous type overlaid DQ type DRAM (4M bits×256 I/O). The DRAM is comprised of a memory cell array 11, a row address buffer 12, a row controller 13, a row pre-decoder 14, a row decoder 15, a column address buffer 16, a /WE buffer 17, a /CAS buffer 18, a flip-flop 19, a column pre-decoder 20, a circuit block 21, a DQ buffer 22, a data I/O buffer 23, a DQ pre-charge/equalize controller 24', a DQ buffer controller 25, a column address transition detector circuit 53, and the like.

As shown in FIG. 6, the 4M-bit memory cell array 11 consists of two 2M-bit arrays 11A and 11B. Each of the 2M-bit arrays 11A and 11B consists of eight 256K-bit cell array blocks, i.e., cell array blocks 11A-0 to 11A-7 and 11B-0 to 11B-7, respectively. Each of the cell array blocks 11A-0 to 11A-7 and 11B-0 to 11B-7 is constructed in a structure of 256 rows×1K columns, and dynamic type memory cells are arranged in a matrix of rows×columns.

The row controller 13 receives a row address strobe (/RAS) signal and controls the row address buffer 12. Under control by the row controller 13, the row address buffer 12 latches row address signals AR0 to AR10 in synchronization with the clock signal CLK and generates interpolation signals X0 to X10 and /X0 to /X10, when the /RAS signal is at a low level. The interpolation signals X0 to X10 and /X0 to /X10 are supplied to the row pre-decoder 14 and are thereby pre-decoded thereby. Thereafter, these signals are supplied to the row decoder 15 and decoded. By interpolation signals X8 to X10 and /X8 to /X10 generated from upper three bits of the row address signal AR0 to AR10, sixteen 256K blocks 11A-0 to 11A-7 and 11B-0 to 11B-7 are subjected to selection and activation. As a result, two blocks (e.g., blocks 11A-7 and 11B-7) sandwiching the row decoder 15 are simultaneously activated. By interpolation signals X0 to X7 and /X0 to /X7 generated from the rest 8 bits of the row address signal, rows of the memory cells in the selected blocks are selected.

The column address buffer 16 latches 3 bits of column address signals AC0 to AC2 in synchronization with the clock signal CLK under control by the /CAS buffer 18, when the column address strove (/CAS) signal goes to a low level. The column address buffer 16 performs flip-flop operation synchronized with the clock signal CLK. The column address buffer 16 converts the column address signals AC0 to AC2 into interpolation signals Y0F to Y2F and /Y0F to /Y2F. The interpolation signals Y0F to Y2F and /Y0F to /Y2F are supplied to the flip-flop 19, and the signals Y0F to Y2F as a part of the interpolation signals are supplied to the column address transition detector circuit 53. The interpolation signals Y0F to Y2F and /Y0F to /Y2F supplied to the flip-flop 19 are converted into interpolation signals Y0S to Y2S and /Y0S to /Y2S. In this state, eight selection signals of the cell array blocks (e.g., /X8·/X9·/X10, X8·/X9·/X10, . . . , and X8·X9·X10 which are abbreviated and indicated as X8·X9·X10 in FIG. 7) generated by the row pre-decoder 14 are also converted into signals X8S·X9S·X10S. These row column address signals are supplied to the column pre-decoder 20 and column switch selection signals CSW0 to CSW3 are generated. The column switch signals CSW0 to CSW3 are generated by obtaining a logical product of upper two bits of Y1S, /Y1S, Y2S, and /Y2S and the signals X8S·X9S·X10S, as expressed in the following logic.

CSW0=/Y1S·/Y2S·X8S·X9S·X10S
CSW1=Y1S·/Y2S·X8S·X9S·X10S
CSW2=/Y1S·Y2S·X8S·X9S·X10S
CSW3=Y1S·Y2S·X8S·X9S·X10S

One of the column switch signals CSW0 to CSW3 corresponding to a selected cell array block is activated by the above logical calculation.

The interpolation signals Y0S and /Y0S output from the column pre-decoder 20 are supplied to the circuit block 21. The circuit block 21 consists of a first circuit block 21A and a second circuit block 21B corresponding to the 2M-bit arrays 11A and 11B, and each of the first and second circuit blocks 21A and 21B is provided with a DQ multiplexer, a DQ pre-charger, a DQ equalizer, and the like. Likewise, a DQ buffer 22 consists of first and second buffer sections 22A and 22B corresponding to the 2M-bit arrays 11A and 11B, and outputs of the buffer sections 22A and 22B are supplied to a data I/O buffer 23, respectively through RWD busses 26A and 26B each consisting of 128 lines (i.e. total 256 lines). The data I/O buffer 23 is also supplied with a clock signal CLK and an output signal /WEI from a /WE buffer 17, and controls inputting/outputting of data.

The /WE buffer 17 is controlled in accordance with an output signal from the /CAS buffer 18 and latches a write enable (/WE) signal. A DQ pre-charge/equalize controller 24' receives an output signal OLSBC (Only-Least-Significant-Bit-Changed) from the column address transition detector circuit 53, a clock signal CLK, and an output signal /WEI described above from the /WE buffer 17, and generates a pre-charge signal /PRCH' which is supplied to the first and second circuit blocks 21A and 21B, thereby to control pre-charging and equalizing of the DQ lines. The DQ buffer controller 25 is supplied with the clock signal CLK and the output signal /WEI from the WE buffer 17 and controls the first and second circuit blocks 22A and 22B of the DQ buffer 22.

256 pairs of DQ lines are provided on the 2M-bit cell arrays 11A and 11B and are connected to the DQ buffers 22A and 22B through the DQ multiplexer, the DQ pre-charger, and the DQ equalizer. This part will be shown in more details in FIG. 8.

1K columns (or a pair of bit lines) of each of the blocks 11A-0 to 11A-7 and 11B-0 to 11B-7 is connected with 1024 sense amplifiers (S/A) 27-0 to 27-1023. Outputs of the sense amplifiers are supplied to multiplexers (4:1 MUX) 28-0 to 28-255, in units of four outputs. Output ends of multiplexers 28-0 to 28-255 are respectively connected to 256 pairs of DQ lines 29-0 and /29-0 to 29-255 and /29-255. By four column switch selection signals CSW0 to CSW3 output from the column decoder 20, one is selected from output signals of four sense amplifiers, supplied to each of the multiplexers 28-0 to 28-255, and is output onto pairs of DQ lines 29-0 and /29-0 to 29-255 to /29-255. The pairs of DQ lines 29-0 and /29-0 to 29-255 and /29-255 are connected with PMOS transistors 30-0 to 30-255 which serve as DQ equalizers, and with PMOS transistors 31-0 to 31-255 and 32-0 to 32-255 which serve as DQ pre-chargers. The current paths of the PMOS transistors 30-0 to 30-255 are connected between the DQ lines 29-0 to 29-255 and a power source Vcc. The current paths of the PMOS transistors 31-0 to 31-255 are connected between the DQ lines /29-0 to /29-255 and the power source Vcc. The gates of the PMOS transistors 30-0 to 30-255, 31-0 to 31-255, and 32-0 to 32-255 are supplied with a pre-charge signal /PRCH' output from the DQ pre-charge/equalize controller 24' to perform ON/OFF control.

The 256 pairs of DQ lines 29-0 and /29-0 to 29-255 and /29-255 are connected to 128 DQ multiplexers (2:1 MUS) 33-0 to 33-127, such that every two pairs of the DQ lines correspond to one DQ multiplexer. Each of the DQ multiplexers 33-0 to 33-12 selects one pair of the two pairs of DQ lines connected thereto, in accordance with interpolation signals Y0S and /Y0S (or the lowermost bit of a column address) output from the column pre-decoder 20. Specifically, when the signal /Y0S is at a high level, pairs of DQ lines 29-0 and /29-0, 29-2 and /29-2, . . . , and, 29-254 and /29-254 are selected, when the signal Y0S is at a high level, pairs of DQ lines 29-1 and /29-1, 29-3 and /29-3, . . . , and, 29-255 and /29-255 are selected, and data on these DQ lines is supplied to the DQ buffers 22-0 to 22-127 and data read out is amplified. Output signals of the DQ buffers 22-0 to 22-127 are respectively supplied to RWD busses 26-0 to 26-127.

In the structure as described above, 1K columns corresponding to the 2M cell arrays 11A and 11B are multiplexed at a ratio of 4:1 by the column switch selection signals CSW0 to CSW3, and are connected to the 256 pairs of DQ lines. In this state, the column switch selection signals CSW0 to CSW3 are used in common by every 256 columns of the 1K columns. Specifically, when one of the column switch selections signals CSW0 to CSW3 is selected, e.g., when the signal CSW0 is selected, 256 sense amplifiers 27-0, 27-4, 27-8, . . . , and 27-1021 are simultaneously connected to the pairs of DQ-lines 29-0 and /29-0, 29-1 and /29-1, . . . and 29-255 and /29-255, and data held by the sense amplifiers is read out onto the DQ lines.

Figure 8:
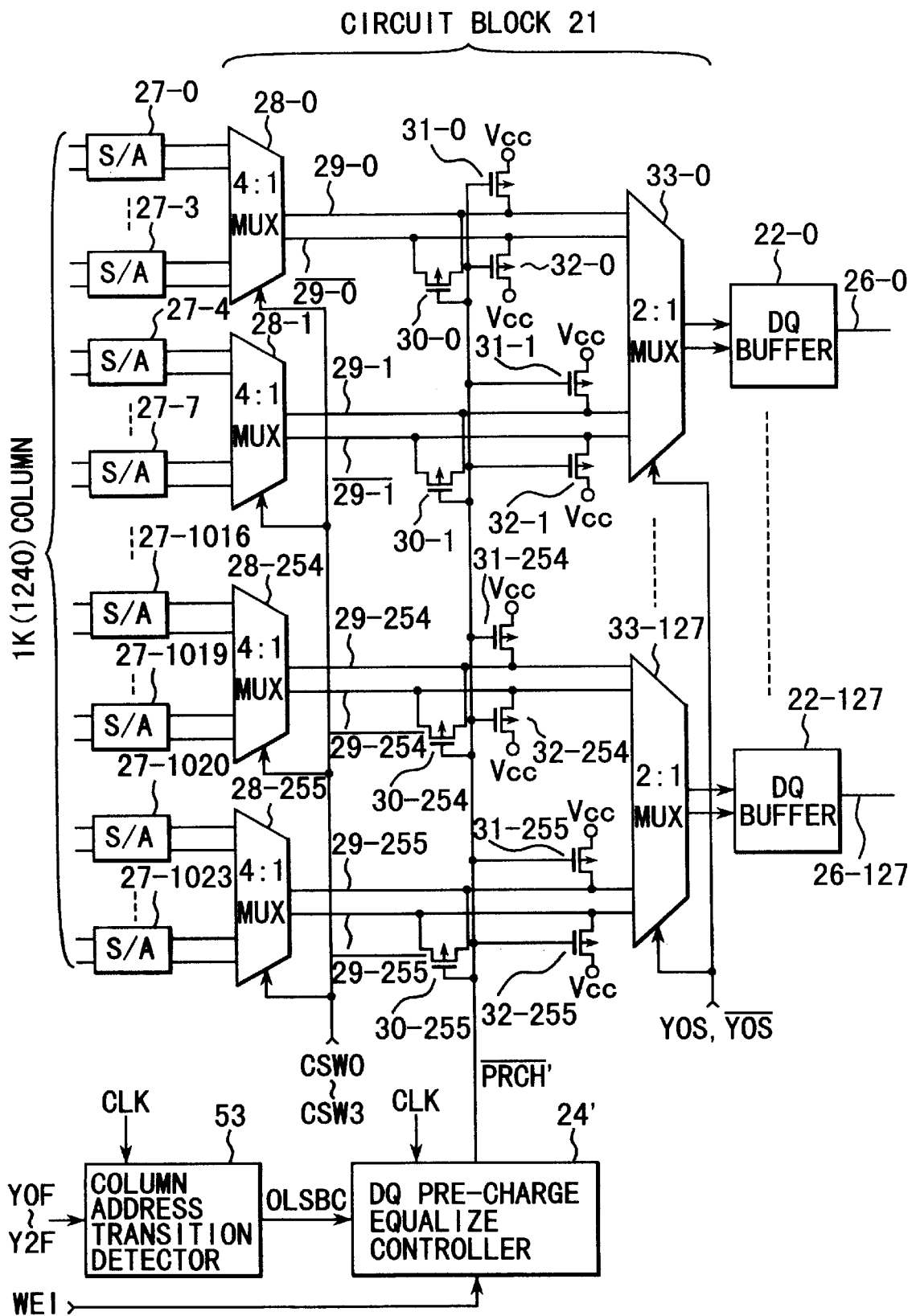
FIG. 8 is a block diagram showing DQ lines shown in FIG. 7 and details of a circuit section in the periphery of the DQ lines.
Figure 9:
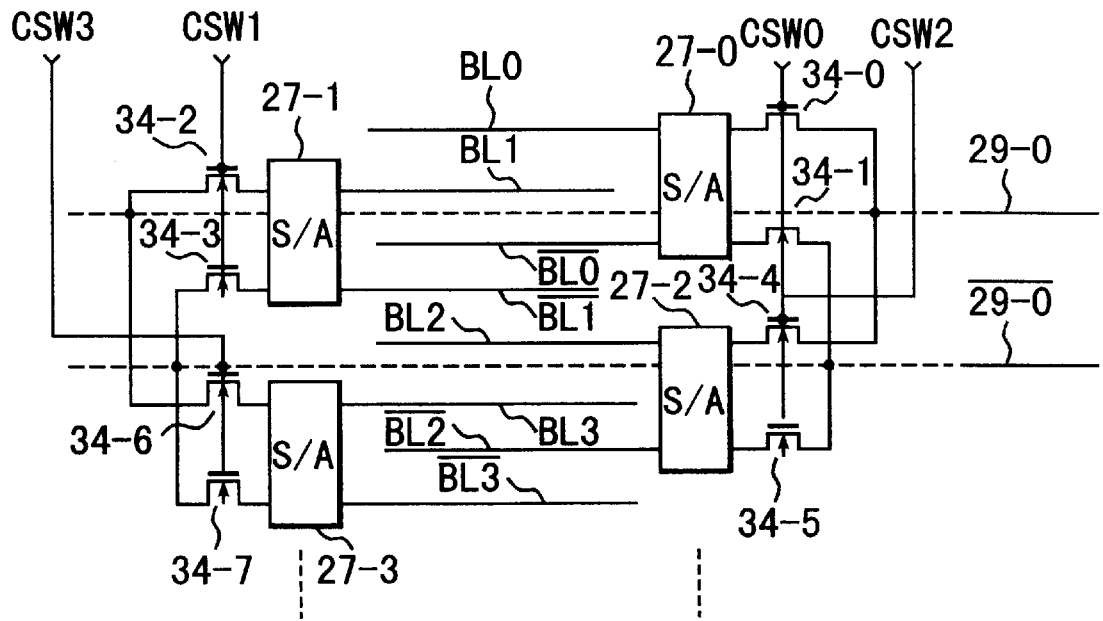
FIG. 9 is a block diagram showing a circuit section relating to bit lines, sense amplifiers, and a pair of DQ lines.

FIG. 9 is a block diagram showing details of a circuit section relating to bit lines, sense amplifiers and pairs of DQ lines shown in the block diagram of FIG. 8.

1K pieces of sense amplifiers 27 are divided into groups each consisting of four sense amplifiers and provided at both ends of each of 256K blocks. The following explanation will be made in view of sense amplifiers 27-0 to 27-3. The sense amplifiers 27-0 to 27-3 are respectively connected with pairs of bit lines BL0 and /BL0 to BL3 and /BL3. The pairs of bit lines BL and /BL are arranged such that bit lines of the sense amplifiers in one side are inserted between bit lines of the other sense amplifiers in the opposite side. Four sense amplifiers 27-0 to 27-3 are connected to a pair of DQ lines 29-0 and /29-0, through current paths of NMOS transistors 34-0 to 34-7 which serve as a multiplexer 28-0, respectively.

The gates of the NMOS transistors 34-0 to 34-7 are supplied with column switch selection signals CSW0 to CSW3, output data of the sense amplifier 27 corresponding to that one of the column switch selection signals which is at a high level is read out onto the pair of DQ lines 29-0 and /29-0.

Specifically, the current path of the transistor 34-0 is connected between an output end of the sense amplifier 27-0 and the DQ line 29-0 and is controlled to be turned on/off by the signal CSW0. The current path of the transistor 34-1 is connected between another output end of the sense amplifier 27-0 and the DQ line /29-0 and is controlled to be turned on/off by the signal CSW0. The current path of the transistor 34-2 is connected between an output end of the sense amplifier 27-1 and the DQ line 29-0 and is controlled to be turned on/off by the signal CSW1. The current path of the transistor 34-3 is connected between another output end of the sense amplifier 27-1 and the DQ line /29-0 and is controlled to be turned on/off by the signal CSW1. Likewise, the current path of the transistor 34-4 is connected between an output end of the sense amplifier 27-2 and the DQ line 29-0 and is controlled to be turned on/off by the signal CSW2. The current path of the transistor 34-5 is connected between another output end of the sense amplifier 27-2 and the DQ line /29-0 and is controlled to be turned on/off by the signal CSW2. Also, the current path of the transistor 34-6 is connected between an output end of the sense amplifier 27-3 and the DQ line 29-0 and is controlled to be turned on/off by the signal CSW3. The current path of the transistor 34-7 is connected between another output end of the sense amplifier 27-3 and the DQ line /29-0 and is controlled to be turned on/off by the signal CSW3.

Thus, the pair of DQ lines 29-0 and /29-0 is used in common by eight cell array blocks on 2M-bit arrays and is arranged on a memory cell array 11 in a direction parallel to the bit lines BL0 and /BL0 to BL3 and /BL3. The other pairs of DQ lines 29-1 and /29-1 to 29-255 and /29-255 are arranged in a similar manner (i.e., in an overlaid DQ structure).

Next, operation of a clock synchronous DRAM shown in FIGS. 7 to 9 will be explained below with reference to a timing chart shown in FIG. 10.

Figure 4:
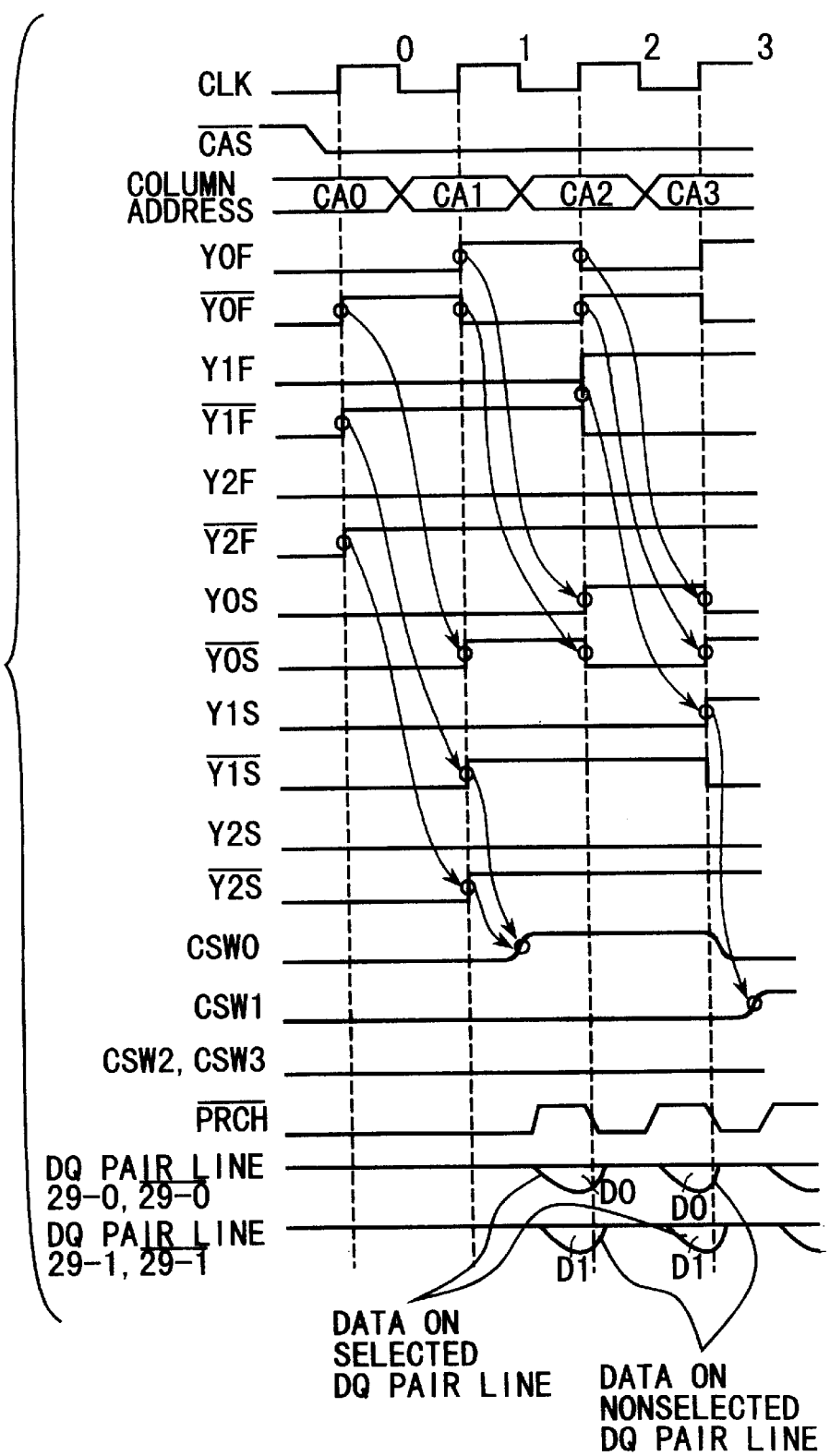
FIG. 4 is a timing chart for explaining operation of each circuit shown in FIGS. 1 to 3.

This timing chart shows internal operating waveforms where column addresses AC0 to AC2 are input in 0th to second clock cycles, like in FIG. 4. Also, like in FIG. 4, it is supposed that a row address has been input, a word line has been selected, and operation of latching data of a selected row has already been carried out.

Figure 10:
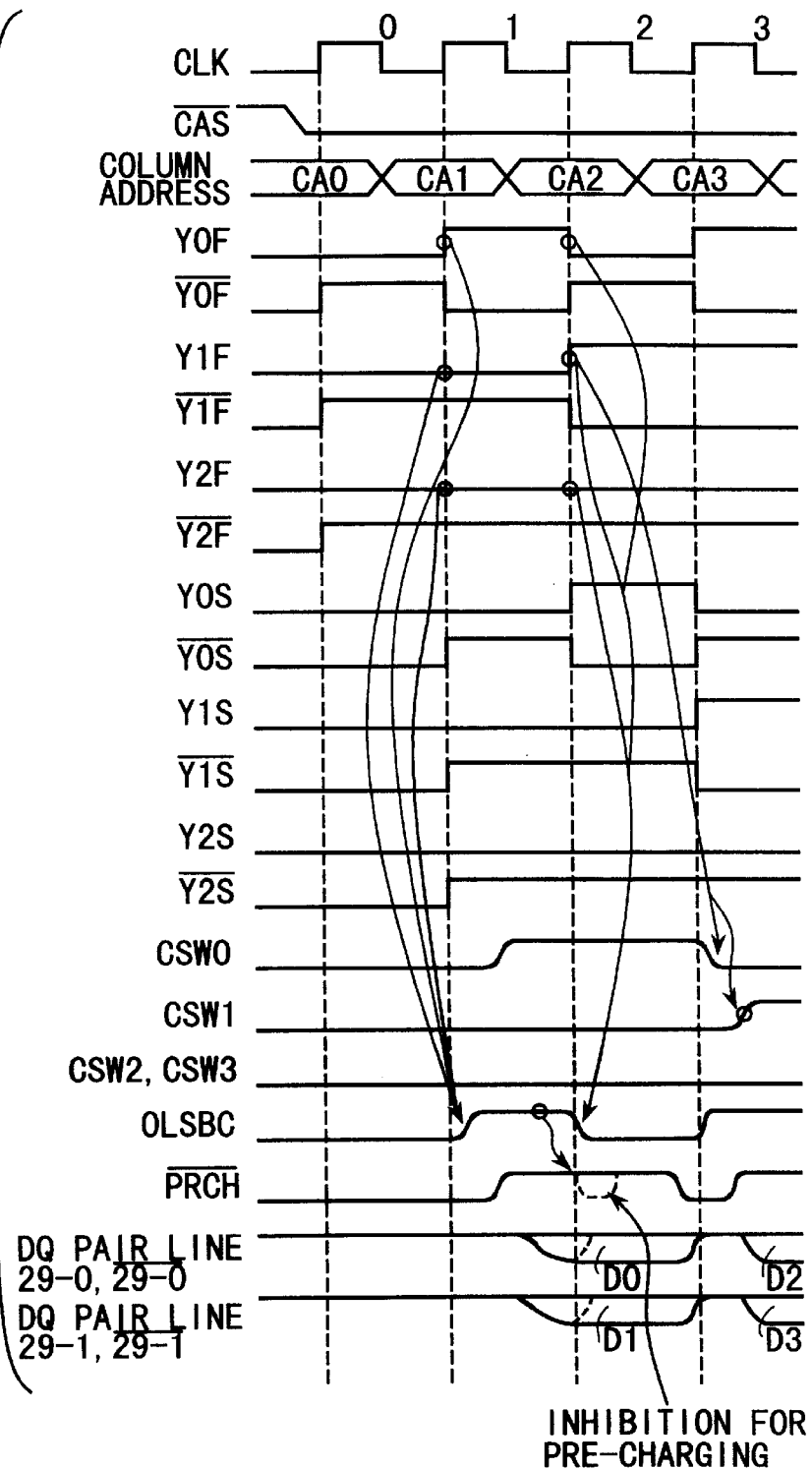
FIG. 10 is a timing chart for explaining operation of a clock synchronous type DRAM shown in FIGS. 7 to 9.

In FIG. 10, the procedure in which input column addresses AC0 to AC2 are transmitted through the pipeline stages PS1 and PS2 and activate signals CSW0 to CSW2 is the same as that in FIG. 4. In the first clock cycle in FIG. 10, the signal Y0F changes but the signals Y1F and Y2F do not change. Accordingly, the signal OLSBC rises. The signal OLSBC is a signal indicating that only the signal Y0F which is a LSB (least significant bit) of a column address is changed but the other column addresses are not changed. In response to the signal OLSBC which goes to a high level, the DQ line pre-charge/equalize control circuit 24' inhibits pre-charge operation in the second clock cycle. As a result of this, wasteful pre-charge operation is not carried out in this cycle, and the DQ multiplexers are switched to the side of the odd-numbered pairs of DQ lines 29-1 and /29-1, 29-3 and /29-3, ..., and 29-255 and /29-255 by the signal Y0S thus turned to a high level. Data is then read out through these pairs of DQ lines.

Next, a column address CA2 is input in the second clock cycle, and the signal Y1F changes in addition to the signal Y0F. Then, the signal OLSBC goes to a low level. In this case, not only the DQ multiplexers but also the column address selection signals CSW0 to CSW2 are switched (so that the CSW0 goes to a low level and the CSW1 goes to a high level), unlike the former case. Data of sense amplifiers (27-1, 27-5, 27-9, ..., 27-1022) newly selected by thus switched signals CSW is read onto pairs of DQ lines, and therefore, it is necessary to pre-charge the pairs of DQ lines before the signals CSW are switched, in order that the reading of data is carried out at a high speed. In the present embodiment, when the signal Y1F is switched, the signal OLSBC goes to a low level, and accordingly, pre-charging of DQ lines is carried out in the third clock cycle.

According to a semiconductor memory device having a structure as described above, the charging and discharging currents of DQ lines are reduced thereby reducing the power consumption. For example, as for the power consumption during burst transfer of data, the ratio of charging and discharging currents of pairs of DQ lines to the entire current is normally about 30% which can be reduced by half to 15% according to the present invention. As a result of this, it is possible to achieve a very low power consumption in a logic mixture type semiconductor device having a large number of data inputs/outputs, as shown in FIG. 6. Also, since the heat generation amount can be restricted by reducing wasteful power consumption, a low cost package can be used for a memory system using a semiconductor memory device of the present invention, so that the cost of the entire system can be reduced due to such a reduced package cost.

Next, explanation will be made of a structure example and operation of a column address transition detector circuit 53 and a pre-charge/equalize controller 24' which realize operation as described above, with reference to FIGS. 11 to 13.

Figure 11:
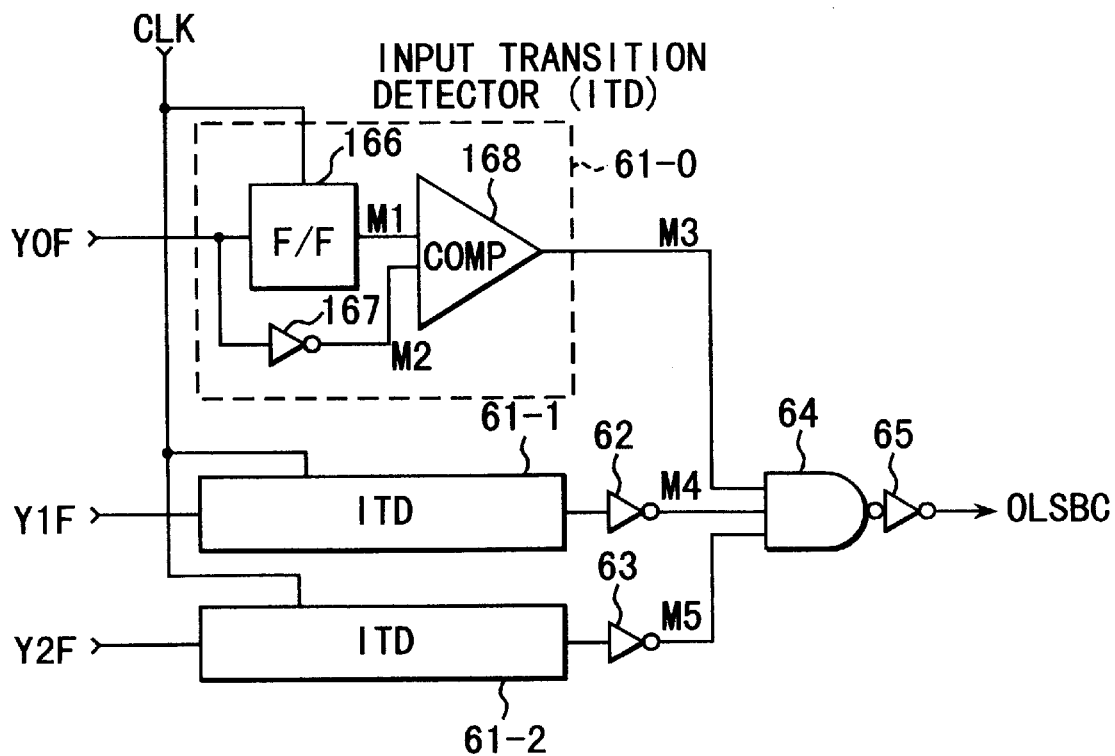
FIG. 11 is a circuit configuration showing a structure example of a column address transition detector circuit shown in FIG. 7.

FIG. 11 is a circuit configuration showing a structure example of a column address transition detector circuit in the circuit shown in FIG. 7. The detector 53 includes input transition detectors 61-0, 61-1, and 61-3, inverters 62, 63, and 65, and a NAND gate 64. The input transition circuit 61-0 is provided with a flip-flop 166 which operates in synchronization with a clock signal CLK, an inverter 167, and a comparator 168. An output signal Y0F from the column address buffer 16 is supplied to the flip-flop 166 and an input end of the inverter 167. An output signal M1 from the flip-flop 166 and an output signal M2 from the inverter 167 are supplied to the comparator 168 and are compared with each other. The input transition detectors 61-1 and 61-2 are constructed in the same structures as that of the detector 61-0, although the structures are simplified in form of blocks in FIG. 11. An output signal M3 from the input transition detector 61-1 is supplied to a first input end of the NAND gate 64, and an output signal (M4) from the input transition detector 61-1 is supplied to a second input end of the NAND gate 64 through the inverter 62. An output signal (M5) from the input transition detector 61-2 is supplied to a third input end of the NAND gate 64 through the inverter 63. Further, an output signal of the NAND gate 64 is supplied as a signal OLSBC to the pre-charge/equalize controller 24' through the inverter 65.

The column address transition detector 53 receives inputs of signals Y0F, Y1F, and Y2F, through the input transition detectors (ITDs) 60-0, 60-1, and 60-2, respectively. The flip-flops 166 in the ITDs 60-0, 60-1, and 60-2 store data input in a preceding cycle. The data is compared with inverted data input currently, by the comparators 168. The comparator 168 outputs a high level if two inputs are of a value equal to each other. In conclusion, the ITDs 60-0, 60-1, and 60-2 detect a situation that currently input data is inverted with respect to data input in a preceding clock cycle, and then, the ITDs are brought into a high level output condition. In the column address transition detector 53 adopts a logic that the signal OLSBC is changed to a high level only when the signal Y0F is changed and the signal Y1F and Y2F are not changed (in this state, all of signals M3, M4, and M5 go to a high level).

FIG. 12 shows a structure example of a DQ pre-charge/equalize controller 24' in the circuit show in FIG. 7. The circuit 24' is comprised of a delay circuit 66 for generating a delay time $\Delta t1$, NAND gates 69, 70, and 76, inverters 71, 73, and 77, a delay circuit 72 for setting a pre-charge pulse width $\Delta t2$ ($\Delta t1 > \Delta t2$), flip-flops 74 and 75, and the like. The signal OLSBC generated by the column address transition detector 53 is supplied to the delay circuit 66. The delay circuit 66 is comprised of inverters 67-0 to 67-4 cascade-connected with each other, and capacitors 68-0 to 68-3 respectively connected between output ends of the inverters 67-0 to 67-3 and ground points Vss. An output signal NA from the delay circuit 66 is supplied to a first input end of the NAND gate 69. A clock signal CLK and an output signal /WEI from the /WE buffer 17 are supplied to the NAND gate 70. An output signal (NB) from the NAND gate 70 is supplied to a second input end of the NAND gate 69 through an inverter 71, and is also supplied to a third input end of the NAND gate 69. The delay circuit 72 is comprised of cascade-connected inverters 78-0 to 78-2, and capacitors 79-0 to 79-2 respectively connected between output ends of the inverters 78-0 to 78-2 and ground points Vss. An output signal ND of the NAND gate 69 is supplied to an input end of the NAND gate 76. A /CAS signal (NE) is supplied to another input end of the NAND gate 76 through the inverter 73 and the flip-flops 74 and 75. An output signal from the NAND gate 76 is output as a pre-charge signal /PRCH' through the inverter 77.

In this circuit, when the /CAS signal is at a low level, the /WE signal is at a high level (in reading operation), and the signal OLSBC is at a low level (in which NA is at a high level and NE is at a high level), a downward pulse having a width $\Delta t2$ set by the delay circuit for setting a pre-charge pulse width is output as a pre-charge signal /PRCH' in synchronization with rising of the clock signal CLK.

Figure 13:
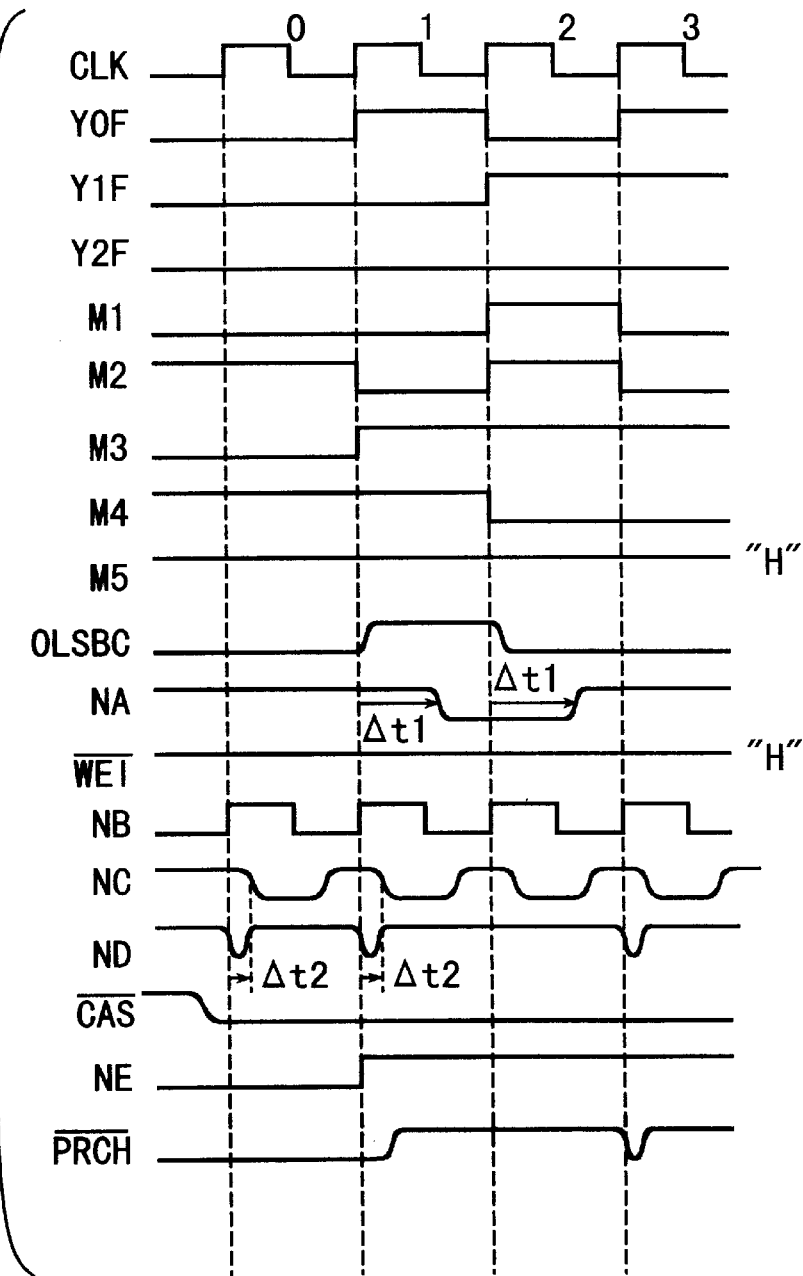
FIG. 13 is a timing chart for explaining operation of each of circuits shown in FIGS. 11 and 12.

FIG. 13 is a timing chart for explaining operation of the column address transition detector 53 and the DQ pre-charge/equalize circuit 24'. In this figure, signal waveforms of signals Y0F, Y1F, and Y2F are extracted from FIG. 10, and waveforms of respective nodes of the column address transition detector 53 and the DQ pre-charge equalize controller 24'. When the signal OLSBC goes to a high level in the first clock cycle, the signal NA rises at a timing delayed by $\Delta t1$ by the delay circuit 66 shown in FIG. 12. The value of $\Delta t1$ is set to be greater than the value of $\Delta t2$ described before ($\Delta t1 > \Delta t2$). Therefore, in the first clock cycle, since the signal NA is at a high level during a period in which the signal NC is at a high level, the signal ND becomes a downward pulse having a width $\Delta t2$, which is output as a pre-charge signal /PRCH'. Next, when the signal OLSBC goes to a low level in the second clock cycle, the signal NA rises at a timing delayed by $\Delta t1$. In this case, since the signal NA is at a low level during the period in which the signal NC is at a high level ($\Delta t1 > \Delta t2$), the signal ND becomes a high level signal, thereby inhibiting pre-charging.

As described above, according to the present embodiment, when only the LSB (least significant bit) of a column address is changed, pre-charging of pairs DQ lines are inhibited. Therefore, charging and discharging currents of pairs of DQ lines can be reduced. Particularly, in case of burst transfer widely used in clock synchronous DRAMs, since sequential column addresses are accessed, pre-charging of pairs of DQ lines is inhibited for every other clock cycle so that current consumption of a chip can be greatly reduced in comparison with a conventional device in which pre-charging is carried out for every clock cycle.

More specifically, in case of the burst transfer described above, the column address buffer 16 is input with a top address of a plurality of sequential column addresses read out sequentially. Therefore, in accordance with the count value of an address buffer counter not shown, sequential addresses subsequent to the top are sequentially generated. The addresses thus generated are supplied to the flip-flop 19 and the column address transition detector 53.

Detailed explanation will be omitted with respect to operation after the flip-flop 19 and the column address transition detector 53, since the operation is the same as that described before. Thus, pre-charging of pairs of DQ lines is inhibited for every other clock cycle with respect to a sequential access request whose column address sequentially changes, and therefore, discharging and charging currents can be very advantageously be reduced.

The embodiment described above is constructed such that pre-charging of pairs of DQ lines is inhibited when only the LSB of a column address is changed. Advantages thereby obtained can be executed greatly during burst transfer. However, depending on the usage of a memory system, there is a case that memory access unlike sequential memory access as described above is frequently made, i.e., memory access whose address does not change regularly like 0, 1, 2, 3, . . . . In this case, the column address transition detector 53 may be constructed so as to detect the greatest change of address bits, and execution/inhibition of pre-charging may be controlled in accordance with presence/absence of detection. In practice, designation of an external address with respect to the column address buffer 16 may be changed.

For example, brief explanation will be made of a case that access in which the external address changes like 0, 4, 8, 12, . . . . When the external address thus changes, the third bit from the lowermost address (LSB) or from the last bit changes most where the external address is expressed as a binary value.

In the above embodiment, the lowermost bit is used as a selection bit for selecting either execution or inhibition of pre-charging of pairs DQ lines. Therefore, if the address is not sequential as described above, the third bit from the last of the external address may be used as a selection bit.

Also, the above embodiment is characterized in that a change of the column address signals (signals Y0F, Y1F, and Y2F) in the first pipeline stage is detected to perform pre-charging control. The column address signals (signals Y0S, Y1S, and Y2S) in the second pipeline stage are not used but the signals Y0F, Y1F, and Y2F are used on the following reason. In the present invention, when only the LSB of the column address changes, control for inhibiting pre-charging of pairs of DQ lines is carried out. However, pre-charging of pairs of DQ lines is normally carried out within a short time period after rising of a clock signal, in order to increase the maximum frequency of the clock signal. Since signals Y0S, Y1S, and Y2S are generated in the same clock cycle as that in which pre-charging is carried out, it is difficult to control pre-charging to be inhibited in time before execution of pre-charging, with use of these signals. Therefore, signals Y0S, Y1S, and Y2S fixed already in a clock cycle preceding the clock cycle in which pre-charging is to be executed are used to obtain a timing margin for control of inhibiting pre-charging.

As a result of this, it is possible to overcome a drawback of a conventional technique that discharging and charging currents of pairs of DQ lines are large in a conventional clock synchronous overlaid DQ type DRAM, and it is possible to provide a clock synchronous overlaid DQ type DRAM in which discharging and charging currents are small and current consumption of a chip is reduced.

As has been explained above, according to the present invention, it is possible to attain a semi-conductor memory device in which power consumption is reduced by reducing discharging and charging currents.

In addition, the heat generation amount can be restricted by reducing wasteful power consumption, so that the cost of a package can be reduced, resulting in a reduction of the cost of the entire system.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

I claim:

1. A semiconductor memory device comprising:
    a memory cell array including a plurality of memory cells;
    an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal;
    a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal;
    a plurality of data lines for transferring data read out from the desired number of memory cells selected;
    a pre-charge circuit for pre-charging the plurality of data lines;
    a multiplexer input with the data read out on the plurality of data lines, for selecting a part of the data lines, based on a selection signal indicating a predetermined part of the address signal;
    an amplifier for amplifying data on the part of the data lines selected by the multiplexer; and
    a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the pre- determined part thereof indicated by the selection signal changes with the predetermined part kept unchanged.

2. A semiconductor memory device according to claim 1, wherein the plurality of memory cells are either DRAM (Dynamic Random Access Memory) cells or SRAM (Static Random Access Memory) cells.

3. A semiconductor memory device according to claim 1, wherein the predetermined part of the address signal indicated by the selection signal is a lowermost address of the address signal.

4. A semiconductor memory device according to claim 1, wherein the predetermined part of the address signal indicated by the selection signal is an address part which changes most frequently in the address signal supplied to the address buffer.

5. A semiconductor memory device according to claim 1, further comprising an address generator for generating a plurality of address signals subsequent to the address signal supplied to the address buffer, as a first address signal, in accordance with a predetermined count value, in a burst transfer mode, and for sequentially supplying the plurality of address signals to the decoder, in accordance with the clock signal, wherein
    the decoder decodes the first address signal output from the address buffer in the burst transfer mode, and thereafter decodes the plurality of address signals supplied from the address generator.

6. A semiconductor memory device comprising:
    a memory cell array of a matrix layout;
    a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal;
    a column decoder for decoding the address signal output from the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal;
    data line groups respectively provided so as to correspond to columns of the column group selected by the column decoder;
    a pre-charge circuit for pre-charging the data line groups;
    a multiplexer input with data on the data line groups, for selecting a part of the data line groups, based on a multiplexer selection address included in the column address signal;
    an amplifier for amplifying data on the part of data lines of the part of the data line groups selected by the multiplexer; and
    a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

7. A semiconductor memory device according to claim 6, wherein the memory cell array includes a plurality of DRAM (Dynamic Random Access Memory) cells or a plurality of SRAM (Static Random Access Memory) cells.

8. A semiconductor memory device according to claim 6, wherein the multiplexer selection address is a lowermost address of the column address signal.

9. A semiconductor memory device according to claim 6, wherein the multiplexer selection address is an address part which changes most frequently in the column address signal supplied to the column address buffer.

10. A semiconductor memory device according to claim 6, further comprising an address generator for generating a plurality of column address signals subsequent to the column address signal supplied to the column address buffer, as a first column address signal, in accordance with a predetermined count value, in a burst transfer mode, and for sequentially supplying the plurality of column address signals to the column decoder, in accordance with the clock signal, wherein the decoder decodes the first column address signal output from the column address buffer in the burst transfer mode, and thereafter decodes the plurality of column address signals supplied from the column address generator.

11. A semiconductor chip comprising:

a memory section; and a logic circuit section for transferring data between the memory section and the logic circuit itself, the memory section including:

a memory cell array including a plurality of memory cells;

an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal;

a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal;

a plurality of data lines for transferring data read out from the desired number of memory cells selected;

a pre-charge circuit for pre-charging the plurality of data lines;

a multiplexer input with the data read out on the plurality of data lines, for selecting a part of the data lines, based on a selection signal indicating a predetermined part of the address signal;

an amplifier for amplifying data on the part of the data lines selected by the multiplexer; and a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the predetermined part thereof indicated by the selection signal changes with the predetermined part kept unchanged.

12. A semiconductor chip according to claim 11, wherein the predetermined part of the address signal indicated by the selection signal is a lowermost address of the address signal.

13. A semiconductor chip according to claim 11, wherein the predetermined part of the address signal indicated by the selection signal is an address part which changes most frequently in the address signal supplied to the address buffer.

14. A semiconductor chip comprising:

a memory section; and a logic circuit section for transferring data between the memory section and the logic circuit itself, the memory section including:

a memory cell array adopting a layout consisting of rows and columns;

a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal;

a column decoder for decoding the address signal output form the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal;

data line groups respectively provided so as to correspond to columns of the column group selected by the column decoder;

a pre-charge circuit for pre-charging the data line groups;

a multiplexer input with data on the data line groups, for selecting a part of the data line groups, based on a multiplexer selection address included in the column address signal;

an amplifier for amplifying data on the part of data lines of the part of the data line groups selected by the multiplexer; and a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

15. A semiconductor chip according to claim 14, wherein the multiplexer selection address is a lowermost address of the column address signal.

16. A semiconductor chip according to claim 14, wherein the multiplexer selection address is an address part which changes most frequently in the column address signal supplied to the column address buffer.

17. A memory system comprising:
   a CPU (central processing unit) supplied with a clock signal;
   a cash memory for sending/receiving data to/from the CPU;
   a system bus for transferring data from and to the cash;
   a bus controller for controlling the system bus; and
   a synchronous DRAM (dynamic random access memory) for burst-transferring data onto the system bus, the synchronous DRAM including:
      a memory cell array having a plurality of memory cells;
      an address buffer supplied with an address signal and a clock signal, for outputting the address signal in synchronization with the clock signal, in a manner in which the address signal is transmitted through pipeline stages into which a pipeline is divided, such that the address signal is moved from one to another one of the pipeline stages for every clock of the clock signal;
      a decoder supplied with the clock signal and input with the address signal output from the address buffer, for decoding the address signal in synchronization with the clock signal, so as to select a desired number of memory cells among the plurality of memory cells, in a manner in which the address signal is transmitted through pipeline stages into which a pipeline is divided, such that the address signal is moved from one to another one of the pipeline stages for every clock of the clock signal;
      a plurality of data lines for transferring data read out from the desired number of memory cells selected;
      a pre-charge circuit for pre-charging the plurality of data lines;
      a multiplexer input with the data read out on the plurality of data lines, for selecting a part of the data lines, based on a selection signal indicating a predetermined part of the address signal;
      an amplifier for amplifying data on the part of the data lines selected by the multiplexer; and
      a controller for controlling the pre-charge circuit, in a manner in which an address transition is detected in one of the pipeline stages which is prior to one of the pipeline stages in which data is read out onto the plurality of data lines from the memory cells selected, and the pre-charge circuit is activated so as to pre-charge the plurality of data lines before data reading, when another part of the address signal than the predetermined part thereof indicated by the selection signal changes with the predetermined part kept unchanged.

18. A memory system according to claim 17, wherein the predetermined part of the address signal indicated by the selection signal is a lowermost address of the address signal.

19. A memory system according to claim 17, wherein the predetermined part of the address signal indicated by the selection signal is an address part which changes most frequently in the address signal supplied to the address buffer.

20. A memory system according to claim 17, further comprising a video memory connected to the system bus, a video controller supplied with an output signal from the video memory, a D/A converter for D/A-converting (or digital/analogue-converting) an output signal from the video controller, and a display supplied with an output signal from the D/A converter, for displaying an image in accordance with the output signal.

21. A memory system comprising:
   a CPU (central processing unit) supplied with a clock signal;
   a cash memory for sending/receiving data to/from the CPU;
   a system bus for transferring data from and to the cash;
   a bus controller for controlling the system bus; and
   a synchronous DRAM (dynamic random access memory) for burst-transferring data onto the system bus, the synchronous DRAM including:
      a memory cell array of a matrix layout;
      a column address buffer input with a column address signal indicating a desired column group of the memory cell array, for outputting the column address signal in synchronization with a clock signal, in a manner in which the column address signal is transmitted through pipeline stages into which a pipeline is divided, such that the column address signal is moved from one to another one of the pipeline stages for every clock of the clock signal;
      a column decoder for decoding the address signal output form the column address buffer in synchronization with the clock signal thereby to select the desired column group, in a manner in which the column address signal is transmitted through pipeline stages into which a pipeline is divided, such that the column address signal is moved from one to another one of the pipeline stages for every clock of the clock signal;
      data line groups respectively provided so as to correspond to columns of the column group selected by the column decoder;
      a pre-charge circuit for pre-charging the data line groups;
      a multiplexer input with data on the data line groups, for selecting a part of the data line groups, based on a multiplexer selection address included in the column address signal;
      an amplifier for amplifying data on the part of data lines of the part of the data line groups selected by the multiplexer; and
      a controller for controlling the pre-charge circuit, in a manner in which an address transition is detected in one of the pipeline stages which is prior to one of the pipeline stages in which the desired column group of the memory cell array is selected and data is read out onto the data line groups from the memory cells selected, and the pre-charge circuit is activated so as to pre-charge the data line groups before data reading, when another column address of the column address signal than the multiplexer selection address changes with the multiplexer selection address kept unchanged.

22. A memory system according to claim 21, wherein the multiplexer selection address is a lowermost address of the column address signal.

23. A memory system according to claim 21, wherein the multiplexer selection address is an address part which changes most frequently in the column address signal supplied to the column address buffer.

24. A memory system according to claim 21, further comprising a video memory connected to the system bus, a video controller supplied with an output signal from the video memory, a D/A converter for D/A-converting (or digital/analogue-converting) an output signal from the video controller, and a display supplied with an output signal from the D/A converter, for displaying an image in accordance with the output signal.

* * * * *